(12) United States Patent
Hsu et al.

(10) Patent No.: US 11,561,330 B2
(45) Date of Patent: *Jan. 24, 2023

(54) PHOTOSENSITIVE MODULE HAVING TRANSPARENT PLATE AND IMAGE SENSOR

(71) Applicant: TDK TAIWAN CORP., Taoyuan (TW)

(72) Inventors: Chen-Er Hsu, Taoyuan (TW); Sin-Jhong Song, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 910 days.

This patent is subject to a terminal disclaimer.

(21) Appl. No.: 16/354,508

(22) Filed: Mar. 15, 2019

(65) Prior Publication Data
US 2019/0285782 A1 Sep. 19, 2019

Related U.S. Application Data

(60) Provisional application No. 62/644,869, filed on Mar. 19, 2018.

(30) Foreign Application Priority Data

Jan. 21, 2019 (CN) .................. 201910053122.X

(51) Int. Cl.
*H04N 5/335* (2011.01)
*G02B 5/20* (2006.01)
(Continued)

(52) U.S. Cl.
CPC ............. *G02B 5/208* (2013.01); *G02B 7/021* (2013.01); *G02B 7/04* (2013.01);
(Continued)

(58) Field of Classification Search
CPC ...................................................... G02B 7/04
See application file for complete search history.

(56) References Cited

U.S. PATENT DOCUMENTS 6,686,588 B1 * 2/2004 Webster ............... H01L 24/97
250/239
9,041,859 B2 * 5/2015 Ji ........................ H04N 5/2253
348/374
(Continued)

FOREIGN PATENT DOCUMENTS

CN 104282698 B 10/2017
CN 209345252 U 9/2019

OTHER PUBLICATIONS

Office Action dated Jun. 28, 2021 in CN Application No. 201910053122. X, 7 pages.

*Primary Examiner* — Gary C Vieaux
(74) *Attorney, Agent, or Firm* — Muncy, Geissler, Olds & Lowe, P.C.

(57) ABSTRACT

A photosensitive module is provided, for receiving light passing through a lens in an electronic device, including a base assembly, a first transparent plate, an image sensor, and a first plastic member. The base assembly includes a substrate having a main body that includes a metal material. The first transparent plate is located on the first side of the base assembly. The image sensor is located on the second side of the base assembly and adjacent to the main body, wherein the first side is opposite the second side. The substrate is disposed between the image sensor and the first transparent plate. The first plastic member is connected to the base assembly. The image sensor is surrounded by the first plastic member. When the photosensitive module receives light, the light passes through the first transparent plate and an opening of the main body sequentially to the image sensor.

16 Claims, 13 Drawing Sheets

(51) Int. Cl.
  *H05K 5/02*    (2006.01)
  *G02B 7/02*    (2021.01)
  *H04N 5/225*   (2006.01)
  *H01L 27/146*  (2006.01)
  *G02B 7/04*    (2021.01)

(52) U.S. Cl.
  CPC .. *H01L 27/14618* (2013.01); *H01L 27/14625* (2013.01); *H04N 5/2253* (2013.01); *H04N 5/2254* (2013.01); *H04N 5/2257* (2013.01); *H04N 5/22521* (2018.08); *H05K 5/0217* (2013.01)

(56) References Cited

U.S. PATENT DOCUMENTS

| | | | |
|---|---|---|---|
| 9,088,705 B1 * | 7/2015 | Tam | H01L 27/1469 |
| 2004/0263669 A1 * | 12/2004 | Kobayashi | H04N 5/22521 |
| | | | 348/E5.025 |
| 2014/0049686 A1 * | 2/2014 | Chen | H01L 27/14625 |
| | | | 348/374 |
| 2015/0281532 A1 * | 10/2015 | Yu | H04N 5/2254 |
| | | | 348/373 |

* cited by examiner

PHOTOSENSITIVE MODULE HAVING TRANSPARENT PLATE AND IMAGE SENSOR

CROSS REFERENCE TO RELATED APPLICATIONS

This application claims the benefit of U.S. Provisional Application No. 62/644,869, filed on Mar. 19, 2018, and China Patent Application No. 201910053122.X, filed on Jan. 21, 2019, the entirety of which is incorporated by reference herein.

BACKGROUND OF THE INVENTION

Field of the Invention

The application relates in general to a photosensitive module, and in particular to a photosensitive module having a transparent plate and an image sensor.

Description of the Related Art

Thanks to ongoing technological developments, the latest electronic devices (such as tablet computers and smartphones) usually include a lens module capable of aiding in photography or recording video, and some are even equipped with dual lens modules, bringing users a wealth of visual enjoyment. However, an image may come out blurry if the user shakes the electronic device when using it. To improve image quality, it is increasingly important to design an effectively shockproof lens module. Furthermore, designers are currently pursuing the miniaturization of such devices, and it is expected that electronic products will be smaller and lighter with each successive generation.

In addition, an image sensor in a lens module generates a large amount of heat when in operation, and the higher the pixel element, the higher the heat generated by the image sensor, so that the temperature of the entire lens module rises sharply. This may cause the module to fail to function properly or even to be damaged. Therefore, how to design a better product is an important issue.

BRIEF SUMMARY OF INVENTION

To address the deficiencies of conventional products, an embodiment of the invention provides a photosensitive module, which can be disposed in an electronic device for receiving light passing through a lens in the electronic device, including a base assembly, a first transparent plate, an image sensor, and a first plastic member. The base assembly includes a substrate, and the substrate has a main body including a metal material. The first transparent plate is located on a first side of the base assembly. The image sensor is located on a second side of the base assembly and adjacent to the main body, wherein the first side is opposite the second side, and the substrate is disposed between the image sensor and the first transparent plate. The first plastic member is connected to the base assembly, and the image sensor is surrounded by the first plastic member. When the photosensitive module receives light, the light passes through the first transparent plate and an opening of the main body sequentially to the image sensor.

In some embodiments, the photosensitive module further comprises a thermal adhesive disposed between the substrate and the image sensor, wherein the thermal adhesive is in contact with the main body of the substrate and the image sensor. The photosensitive module further comprises a first insulating layer, a second insulating layer and a circuit layer, wherein the circuit layer is disposed on the first insulating layer and the second insulating layer, and the circuit layer is electrically connected to the image sensor, and the first insulating layer and the second insulating layer each have an opening, the thermal conductive adhesive is disposed in the openings, and the thermal conductive adhesive is in contact with the main body of the substrate and the image sensor through the openings.

In some embodiments, the thermal adhesive has two thermally conductive regions which are separated from each other, and the two thermally conductive regions are disposed on opposite sides of the opening of the second insulating layer. The opening of the main body of the substrate is smaller than the opening of the first insulating layer and the opening of the second insulating layer. The substrate further has an extended region, and the extended region is connected to the main body, wherein the main body and the extended region include a metal material, and the metal material of the extended region is different than the metal material of the main body.

In some embodiments, the first plastic member has at least one through hole penetrating a side wall of the first plastic member. The first plastic member has a rectangular structure, the through hole is located on the side wall of the rectangular structure, and the through hole has an outer opening and an inner opening, wherein the outer opening is farther away from a reference surface of the substrate than the inner opening.

In some embodiments, the photosensitive module further comprises a lead assembly connecting the image sensor and the base assembly, wherein the lead assembly is encapsulated by the first plastic member, and the lead assembly at least partially overlaps the image sensor in a light-incident direction. The photosensitive module further comprises a soldering assembly connecting the image sensor to the base assembly, wherein the first plastic member encapsulates the soldering assembly, and the soldering assembly overlaps the image sensor in a light-incident direction.

In some embodiments, the photosensitive module further comprises a second plastic member connected to the base assembly and carrying the first transparent plate, wherein the first plastic member is disposed on the first side of the base assembly, and the second plastic member is disposed on the second side of the base assembly. The photosensitive module further comprises a vibration assembly disposed on the second plastic member for driving the first transparent plate. The photosensitive module further comprises a second transparent plate, wherein the first transparent plate and the second transparent plate are arranged on the second plastic member along the light-incident direction. The second transparent plate is located between the first transparent plate and the image sensor, and the second transparent plate is affixed to the second plastic member.

In some embodiments, the vibration assembly includes at least two vibration members: a first vibration member and a second vibration member, and both the first vibration member and the second vibration member are disposed on the second plastic member and are configured to drive the second transparent plate, wherein the first vibrating member drives the first transparent plate to move in a first direction, the second vibrating member drives the first transparent plate to move in a second direction, and the first direction is different than the second direction. In some embodiments, the photosensitive module further comprises a catching member disposed outside the first plastic member and adjacent to the first transparent plate, for capturing the dust that falls from the transparent plate because of the vibration produced by the vibration assembly.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical systems are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
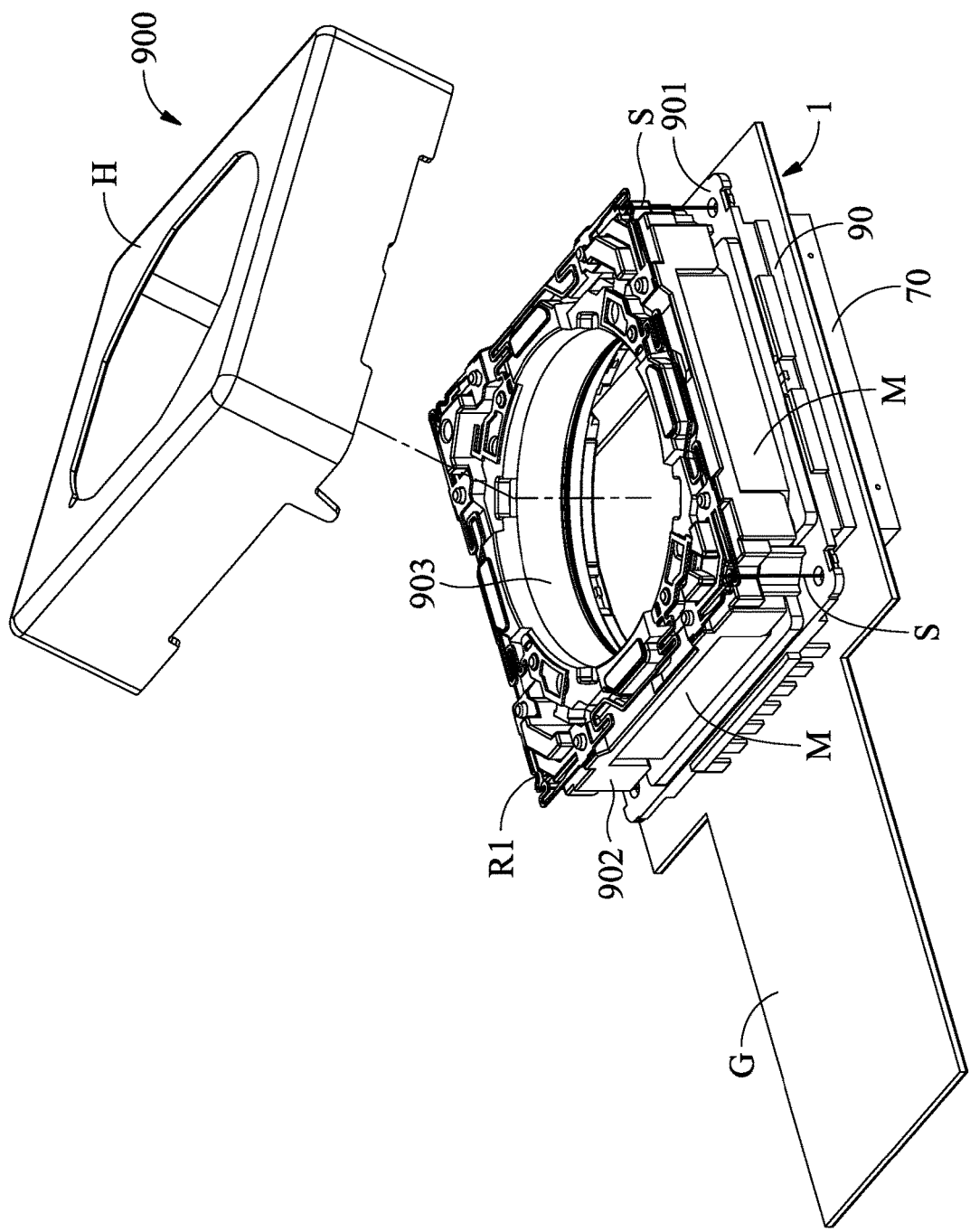
FIG. 1 is a schematic diagram of a photosensitive module and an optical driving mechanism according an embodiment of the present invention.

FIG. 1 is an exploded view showing a photosensitive module 1 with an optical driving mechanism 900 according to an embodiment of the present invention. The photosensitive module 1 is disposed under the optical driving mechanism 900, and the optical driving mechanism 900 can be used to drive and sustain an optical element (such as a lens), and the optical driving mechanism 900 and the optical element can be disposed inside an electronic device (such as a camera, a tablet or a mobile phone). When light (incident light) from the outside enters the optical driving mechanism 900, the incident light passes through the optical element in the light-incident direction O (or light direction or optical axis), and reaches an image sensor on the photosensitive module 1, to acquire an image. The structure of the optical driving mechanism 900 associated with the photosensitive module 1 will be described below.

Figure 2:
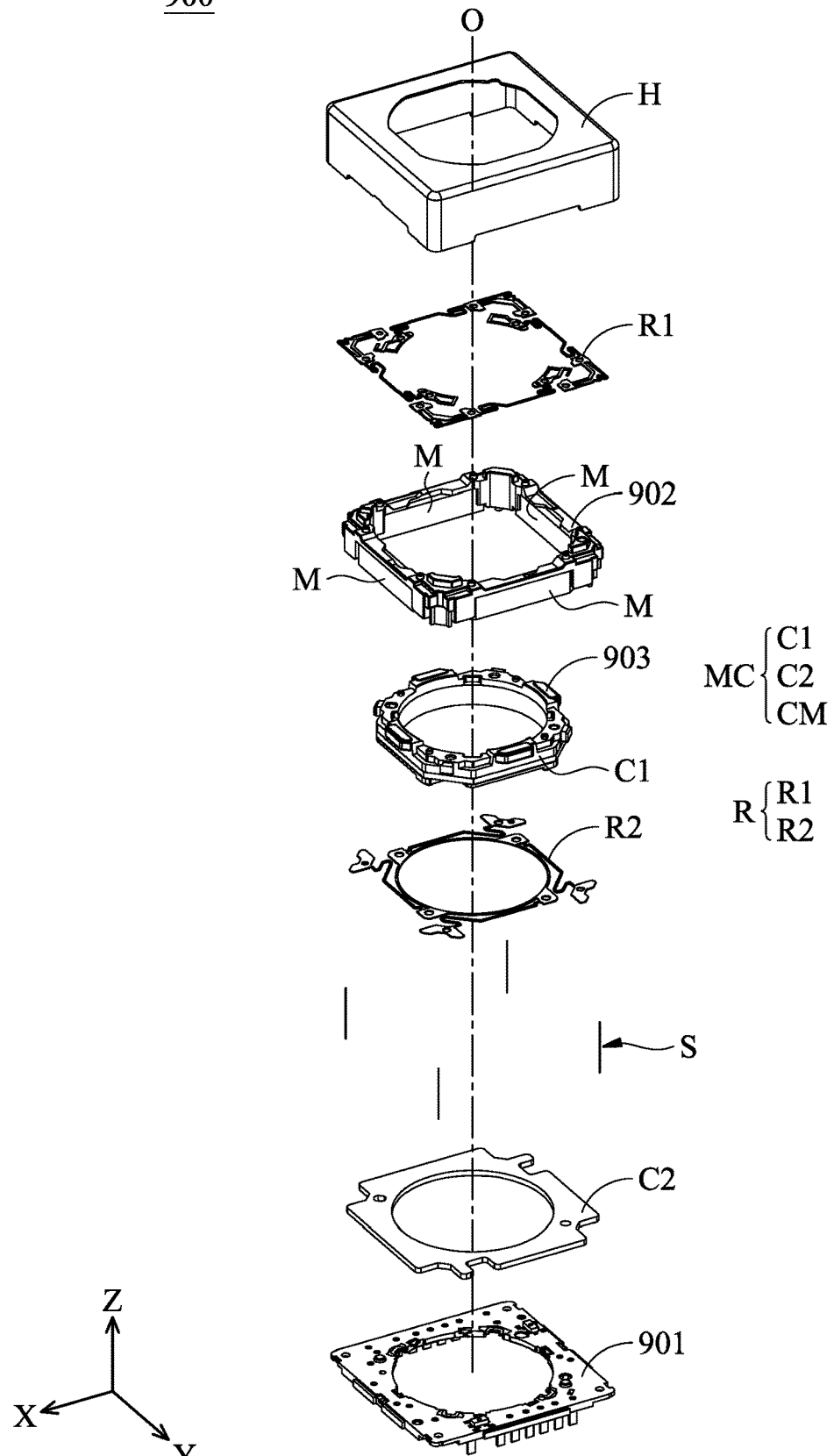
FIG. 2 is an exploded view diagram of the optical driving mechanism in FIG. 1.

Refer to FIG. 2, which shows that the optical driving mechanism 900 includes a base 901, a frame 902, a holder 903, an electromagnetic driving assembly MC, a leaf spring assembly R, an elastic assembly S and a housing H. The housing H is disposed on the base 901 to form an accommodating space for accommodating the frame 902, the holder 903, the electromagnetic driving assembly MC, the leaf spring assembly R and the elastic assembly S. The holder 903 can be used to carry an optical element (for example, a lens). The frame 902 is disposed outside the holder 903. The electromagnetic driving assembly MC includes a plurality of magnetic elements M (for example, magnets), a coil C1 and a plate coil C2, wherein the coil C1 is disposed around the holder 903, and the magnetic elements M are disposed on the frame 902 and around the holder 30 to face the coil C1, and the flat coil C2 is disposed on the base 901. The leaf spring assembly R includes an upper leaf spring R1 and a lower leaf spring R2 that are movably connected to the holder 903 and the frame 902, so that the holder 903 is movable relative to the frame 902.

When a driving signal (for example, a driving current) is applied to the coil C1 by an external power source (not shown), a magnetic force can be generated between the magnetic elements and the coil to drive the holder 903 to move relative to the frame 902, for optical focusing or shake compensation. In addition, the upper and lower leaf springs R1 and R2 keep the holder 903 in an initial position relative to the frame 902 before the driving signal is applied. The electromagnetic driving assembly MC in this embodiment is a moving coil type. In other embodiments, it may be a moving magnetic type.

The elastic assembly S has four elongated elastic elements disposed at four corners of the base 901 and connects the base 901 and the frame 902, so that the frame 902 is movable relative to the base 901. The flat coil C2 can be arranged to correspond to the magnetic elements M. As the magnetic force generated between the magnetic elements M and the coil C1 to move the holder 903 by applying a driving signal to the coil C1, a driving signal also can be applied to the flat coil C2, and a magnetic force generated between the magnetic elements M and the flat coil C2, to drive the holder 903 (with the optical element disposed therein) and the frame 902 to move (for example, moving on the XY plane), to achieve the offset compensation and shockproof effect. In other embodiments, the elastic assembly S can also include one elastic element with a suitable guiding mechanism (such as a slide rail) or other number (for example, two or three) of elastic elements.

The base 901 may be provided with a magnetic field sensing element for sensing a change in the magnetic field of the magnetic element M. Specifically, the magnetic field sensing element can be a Hall Effect Sensor, the magnetic element M can be a permanent magnet, and the Hall effect Sensor can detect the magnetic field change of the permanent magnet, to determine the position of the permanent magnet, thereby detecting the positional deviation of the holder 903 and the optical element disposed therein relative to the base 901 due to vibration. In some embodiments, the magnetic field sensing element can also use other types of sensing components, such as a magnetoresistive sensor (MRS) or an optical sensor, to sense the relative positions of the holder 903, the frame 902 and the base 901.

The present invention provides a photosensitive module of several embodiments, such as the following photosensitive modules 1 to 4, which can be individually combined with the optical driving mechanism 900 to form a camera module. The detailed structure of the above-described photosensitive modules 1 to 8, 100, 200, and 300 will be described below.

Embodiment 1

Figure 3A:
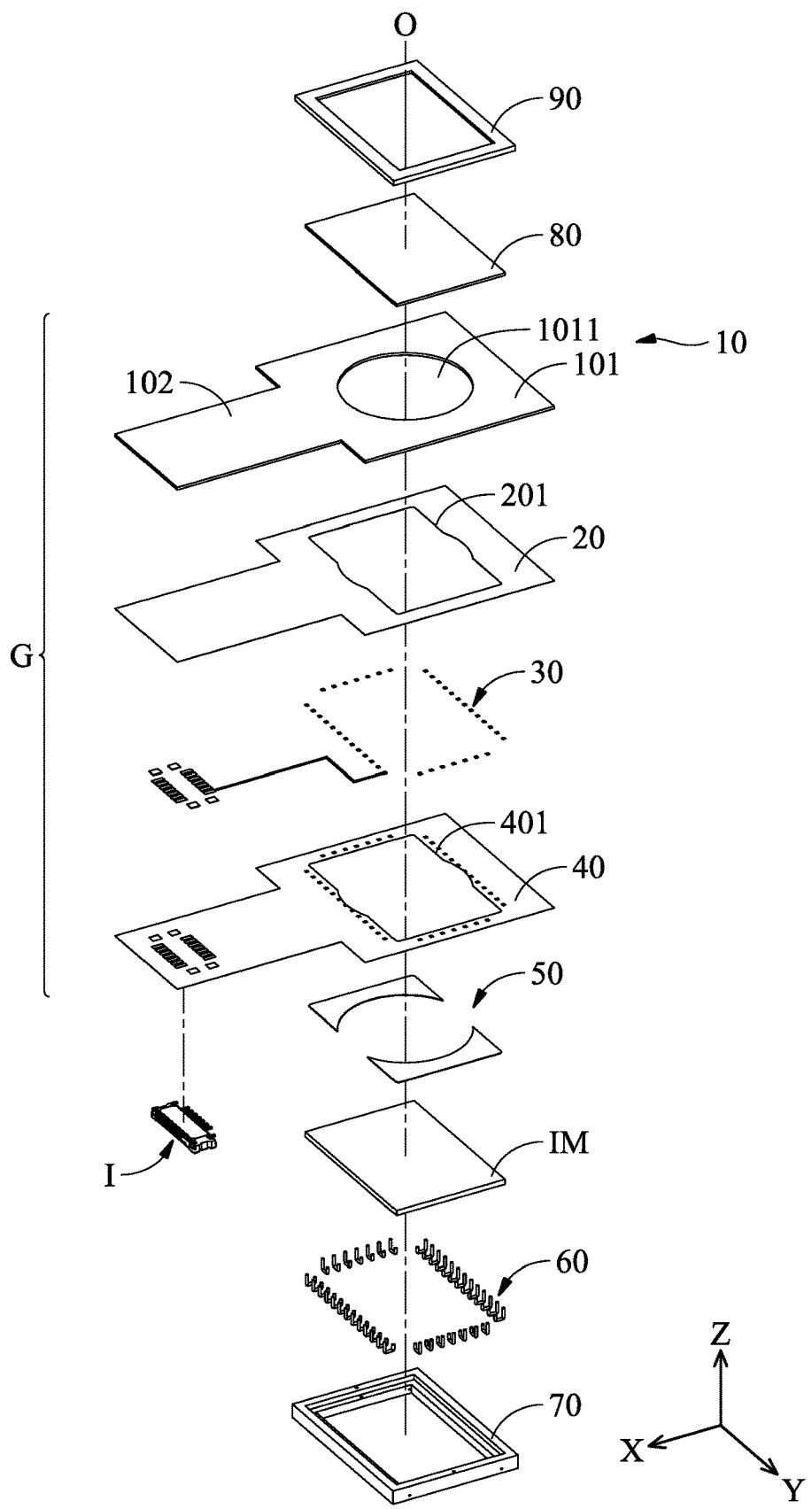
FIG. 3A is an exploded view diagram of the photosensitive module in FIG. 1.
Figure 4A:
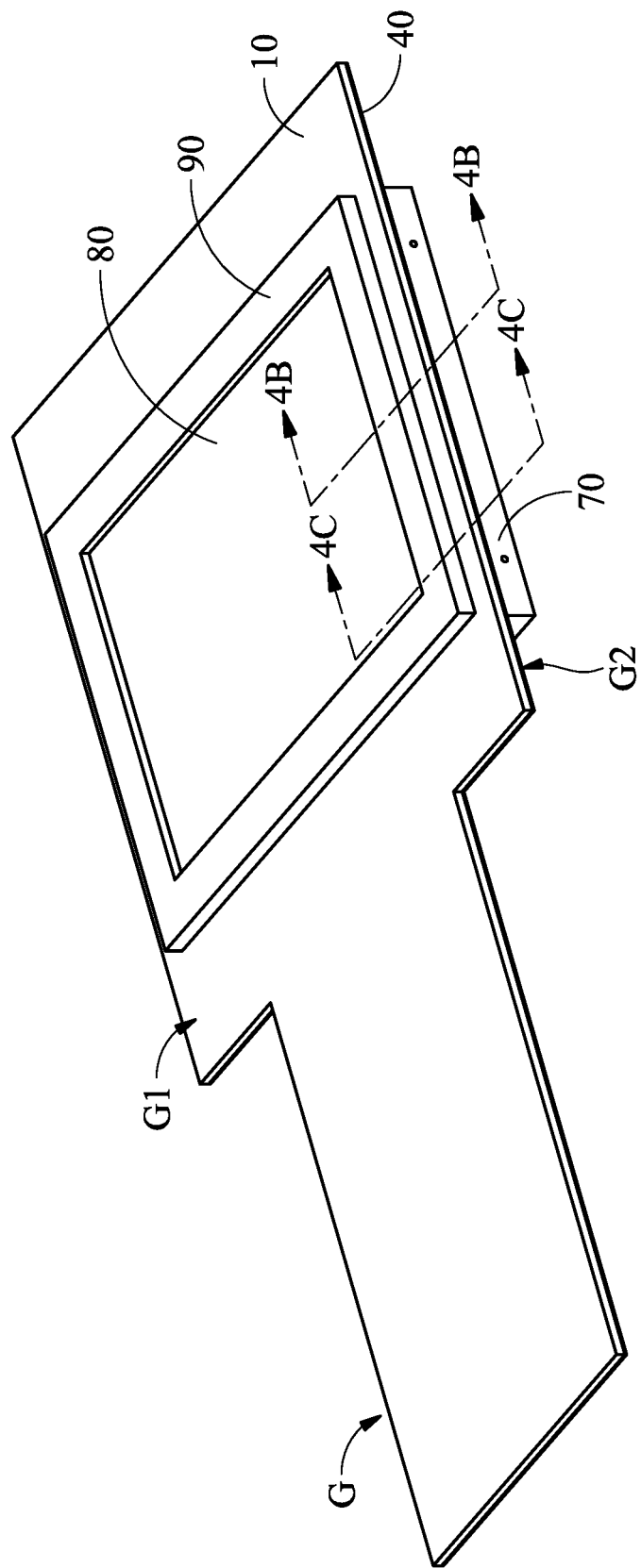
FIG. 4A is a schematic diagram of the photosensitive module in FIG. 3A after assembly.

Refer to FIG. 3A, the photosensitive module 1 can be used to receive light passing through an optical component (such as a lens) of the optical driving mechanism 900, and includes a base assembly G (including a substrate 10 and a first insulating layer 20, a circuit layer 30 and a second insulating layer 40), a thermal conductive adhesive 50, an image sensor IM, a lead assembly 60, a first plastic member 70, a transparent plate 80 and a second plastic member 90. As shown in FIGS. 3A and 4A, a first side G1 of the base assembly G (top side; at a position above the base assembly G) is provided with a transparent plate 80 and a second plastic member 90 for protecting the transparent plate 80, and a second side G2 of the base assembly G (under side; at a position under the base assembly G) is provided with an image sensor IM, a conductive lead assembly 60, a thermal conductive adhesive 50 for conducting heat dissipation, and a first plastic member 70 for protecting the image sensor IM.

Regarding the details of the base assembly G, the substrate 10 thereof defines a main body 101 and an extended region 102. The main body 101 of the substrate 10 includes or is made of a metal material. The extended region 102 may include or be made of a metal material that is different than that of the main body 101, or include or be made of a plastic material. A connection unit may be disposed on the extended region 102 to connect with components outside the photosensitive module 1, for example, the connecting member I in FIG. 3A. The first insulating layer 20 is disposed between the substrate 10 and the circuit layer 30, and the circuit layer 30 is disposed between the first insulating layer 20 and the second insulating layer 40. The first insulating layer 20 can be used to block the circuit layer 30 from being electrically connected to the substrate 10 above (Z-axis) to avoid short-circuiting, and the second insulating layer 40 can be used to prevent the circuit in other mechanisms or the circuit board assembly located underneath the second insulating layer 40 (Z-axis) from forming an electrical connection with the circuit layer 30 and thereby causing a short-circuit. The circuit layer 30 covers the first circuit layer 20, and the second insulating layer 40 covers the circuit layer 30. The second insulating layer 40 also has an opening 401 that corresponds to the opening 201 of the first circuit layer 20 to expose a portion of the substrate 10. The main body 101 and the second insulating layer 40 also expose a plurality of electrical connection points (or contacts) of the circuit layer 30. The main body 101 has an opening 1011, wherein light is allowed to pass through the opening 1011 along the light-incident direction O to the image sensor IM which is below the base assembly G, to obtain an image.

Figure 3B:
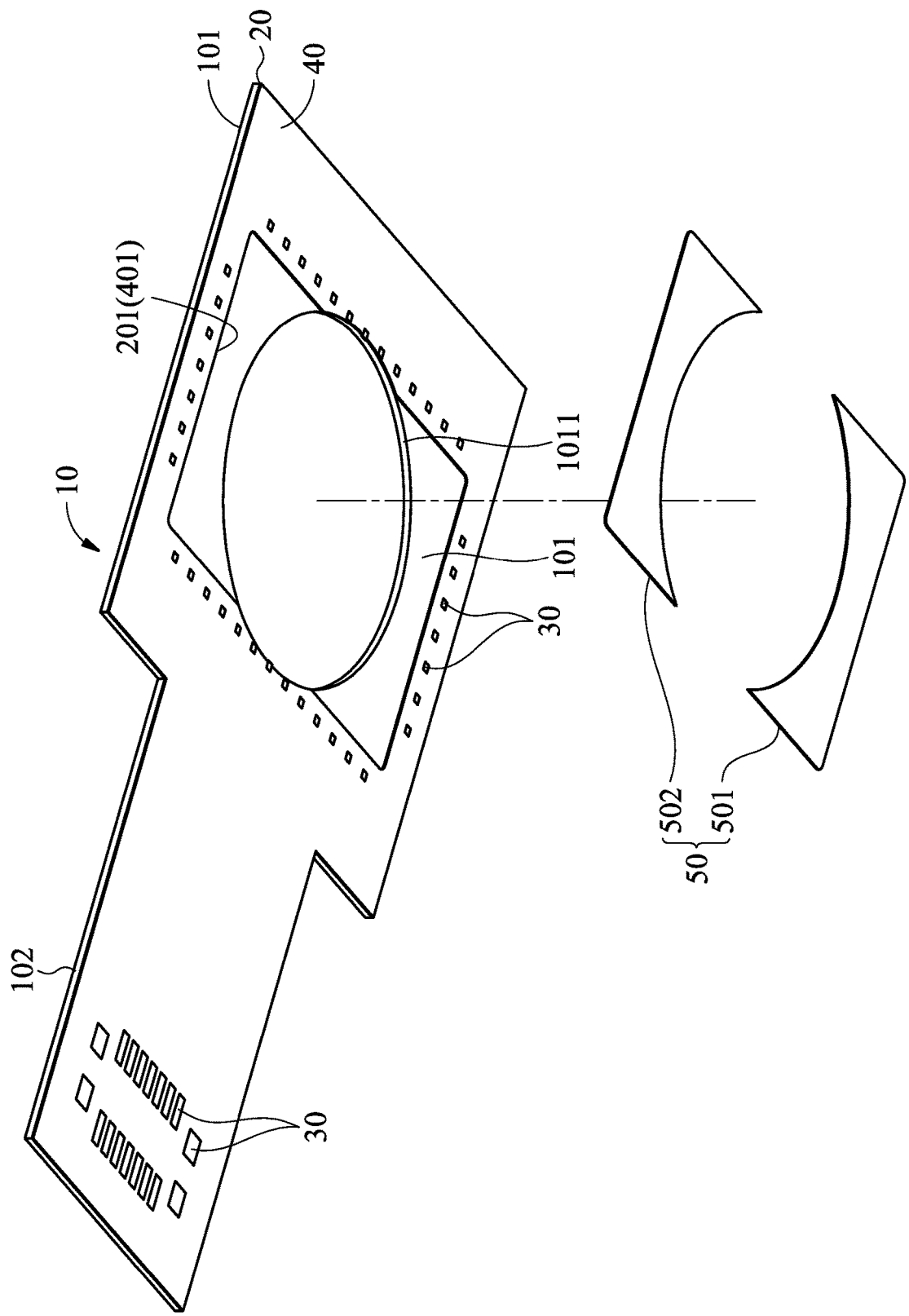
FIG. 3B is a schematic diagram of the base assembly in FIG. 3A.
Figure 4B:
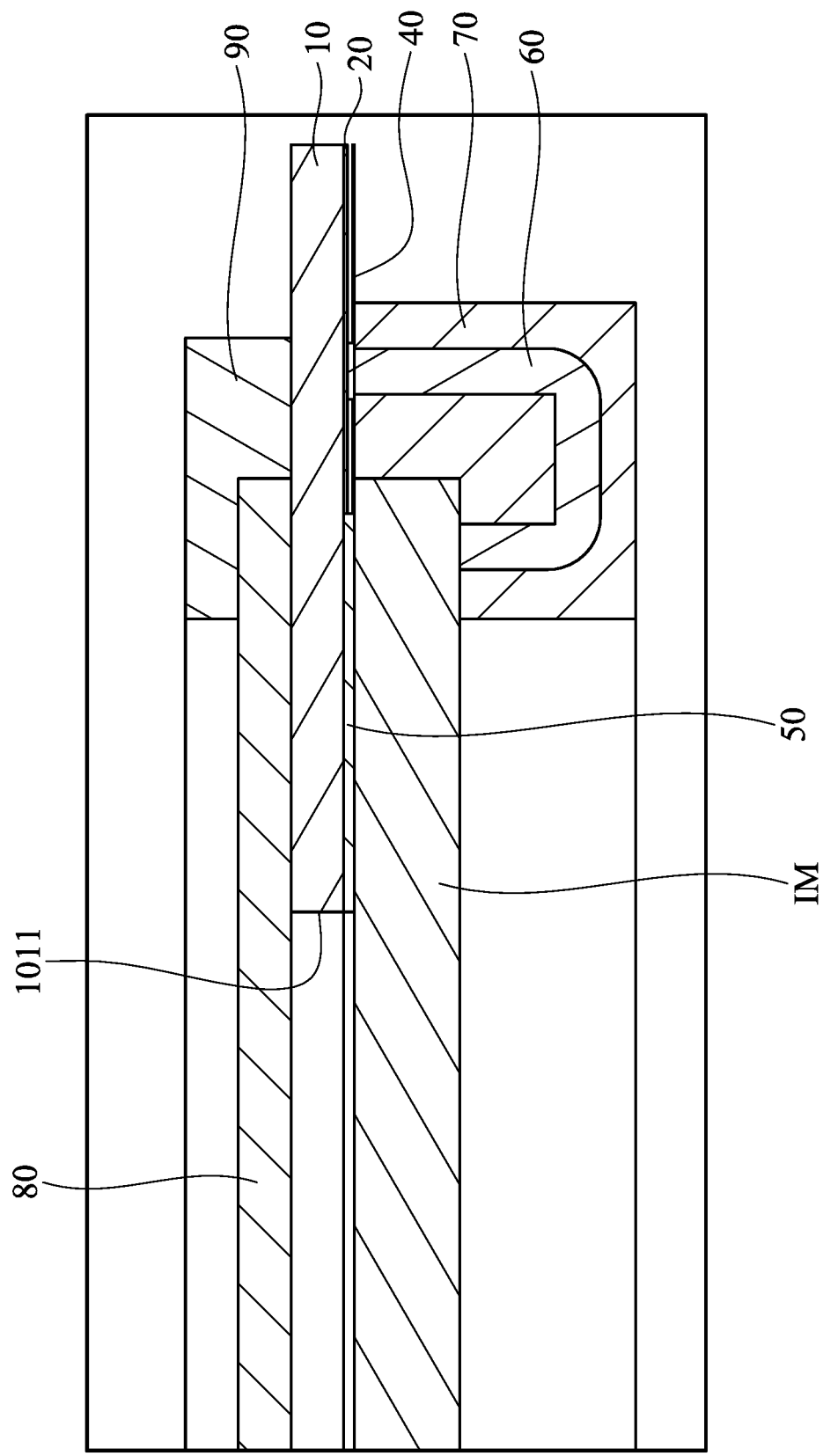
FIG. 4B is a cross-sectional view along line 4B-4B in FIG. 4A.

The thermal conductive adhesive 50 is provided under the substrate 10 or base assembly G. The thermal conductive adhesive 50 may be, for example, a thermal conductive resin. In detail, the thermal conductive adhesive 50 is disposed in the openings 201 and 401 of the first and the second insulating layers 20 and 40, and the opening 1011 of the main body 101 of the substrate 10 is smaller than the openings 201 and 401 of the first insulating layer 20 and the second insulating layer 40 (as shown in FIG. 3B). The thermal conductive adhesive 50 has two thermally conductive regions 501 and 502 which are separated from each other, and they are respectively disposed on both sides of the opening 401 of the second insulating layer 40. The thermal conductive paste 50 is in contact with the main body 101 of the substrate 10 which is exposed by the openings 201 and 401, that is the thermal conductive adhesive 50 is connected to the image sensor IM and the main body 101 of the substrate 10 through the openings 201 and 401. Therefore, the heat generated by the image sensor IM can be dissipated through the thermal conductive adhesive 50 and the substrate 10 which includes a metal material, as shown in FIG. 4B (a cross-sectional view of the assembled photosensitive module 1 along line 4B-4B), thereby further improving the heat dissipation efficiency of the photosensitive module 1. In the present embodiment, the opening 1011 has a substantially circular structure, and the openings 201 and 401 have a substantially rectangular structure and have curved sides to correspond to the opening 1011.

Figure 4C:
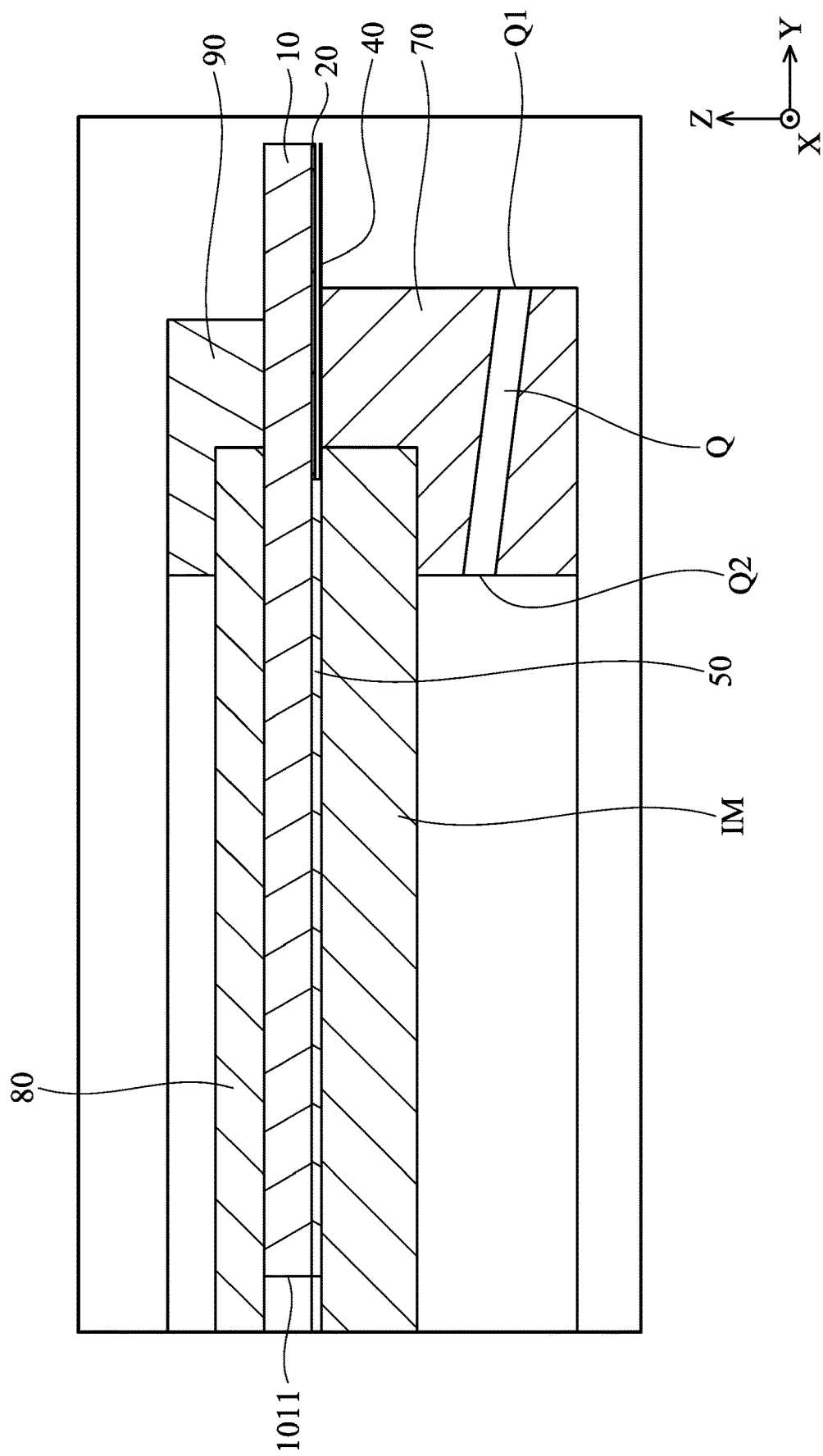
FIG. 4C is a cross-sectional view along line 4C-4C in FIG. 4A.

It should be noted that, as shown in the cross-sectional views of FIGS. 4A and 4C, the first plastic member 70 has a plurality of through holes Q substantially at the four corners of the rectangular structure of the first plastic member 70. Or, the through holes Q are respectively located on the side walls of the rectangular structure and penetrating the side walls. The space under the image sensor IM or surrounded by the first plastic member 70 can be connected to the outside through the through holes Q. This configuration avoids situations in which the air in the enclosed space inside the photosensitive module 1 expands and thereby causes the photosensitive module 1 to become deformed or destroyed by the high heat and high pressure generated by other processing procedures. Moreover, each through hole Q has an outer opening Q1 and an inner opening Q2, wherein the outer opening Q1 is further from the image sensor IM than the inner opening Q2, and the position of the outer opening Q1 is lower than the position of the inner opening Q2 in Z-axis direction. That is, the outer opening Q1 is farther away from the reference surface (XY-plane) of the substrate 10 than the inner opening Q2. The through hole Q has a slope which is inclined toward the inside of the photosensitive module 1 or the image sensor IM. Therefore, the chance of foreign matter entering the photosensitive module 1 can be avoided or greatly reduced during the manufacturing process.

The lead assembly 60 has a plurality of leads disposed around the image sensor IM, and is electrically connected to the image sensor IM and the plurality of electrical connection points of the circuit layer 30 exposed by the second insulating layer 40, and the first plastic member 70 is encapsulated around the lead assembly 60 for protection. The second plastic member 90 is used for fixing the transparent plate 80 to the first plastic member 70 and protecting the transparent plate 80. The transparent plate 80 can be an infrared filter or a low-pass filter which is able to block heat or infrared light which is unnecessary. Both the first and the second plastic members 70 and 90 have a hollow structure. When light from the outside passes through the lens in the optical driving mechanism 900 to the photosensitive module 1, the light passes through the transparent plate 80 and the image sensor IM of the photosensitive module 1 in sequence. In addition, a connecting member I is disposed on the base assembly G and electrically connects the exposed electrical connection points of the circuit layer 30, which can be used as a connector for connecting the outside of the photosensitive module 1.

In this embodiment, the main body 101 of the substrate 10 can be used to dissipate the heat of the image sensor IM, and the extended region 102 can be used to provide with circuit thereon. The main body 101 and the extended region 102 may include different metal materials. For example, the main body 101 includes a metal having high thermal conductivity, such as an aluminum-copper alloy; and the extended region 102 includes a metal that is easy to process, such as copper. In another embodiment, the extended region 102 can be made of plastic.

In this embodiment of the present invention, the heat dissipation efficiency can be greatly improved by providing the thermal conductive adhesive 50 to be in contact with the image sensor IM, so that the overall photosensitive module 1 and camera system can be more stable, and the electrical connection structures and the transparent plate 80 are more stable. Furthermore, the electrical connection structure and the transparent plate 80 protected by the first and the second plastic members 70 and 90, a better protection is provided, which can improve the reliability of the module. Furthermore, since the substrate 10 which has a metal material as a base is flat, this reduces the degree of skew of the image sensor IM relative to the substrate 10, in addition to being advantageous in providing other electronic components (for example, the connecting member I) disposed on the substrate 10, thereby simplifying the overall wiring and aiding in miniaturization.

Embodiment 2

Figure 5A:
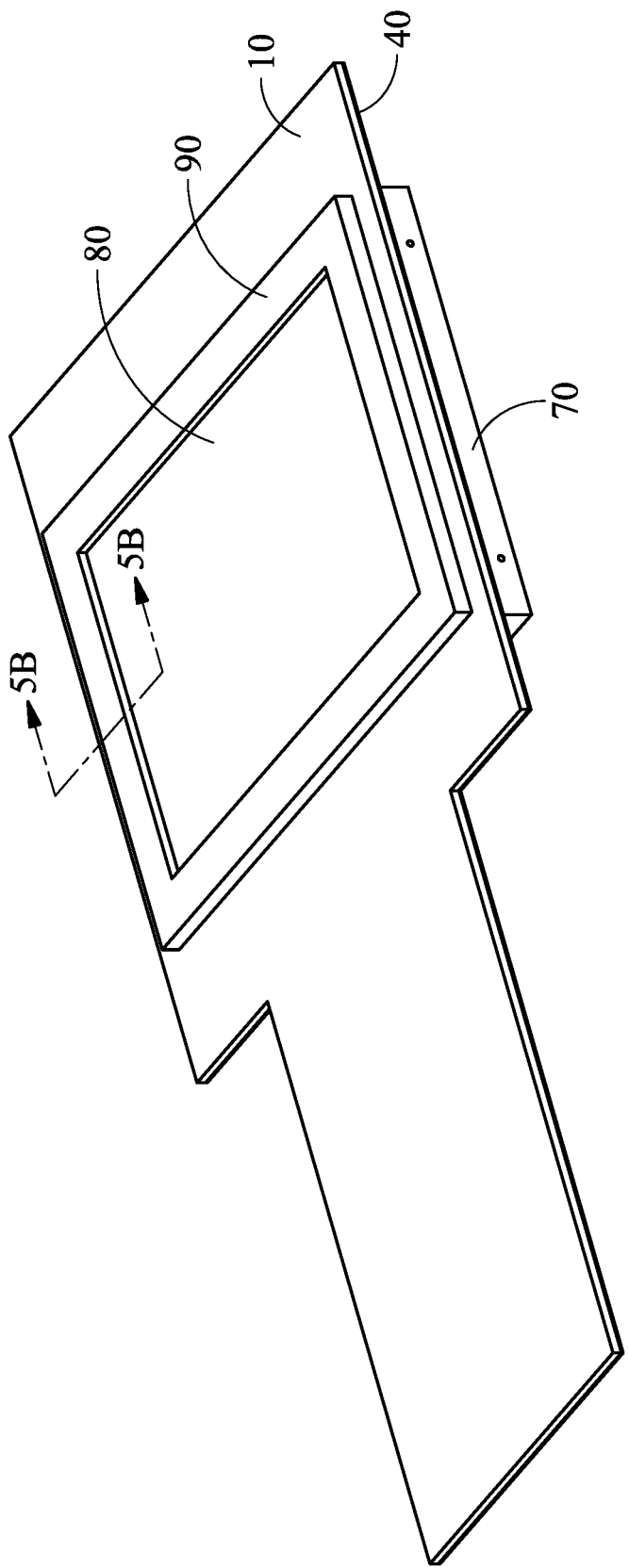
FIG. 5A is a schematic diagram of a photosensitive module according to another embodiment of the present invention.
Figure 5C:
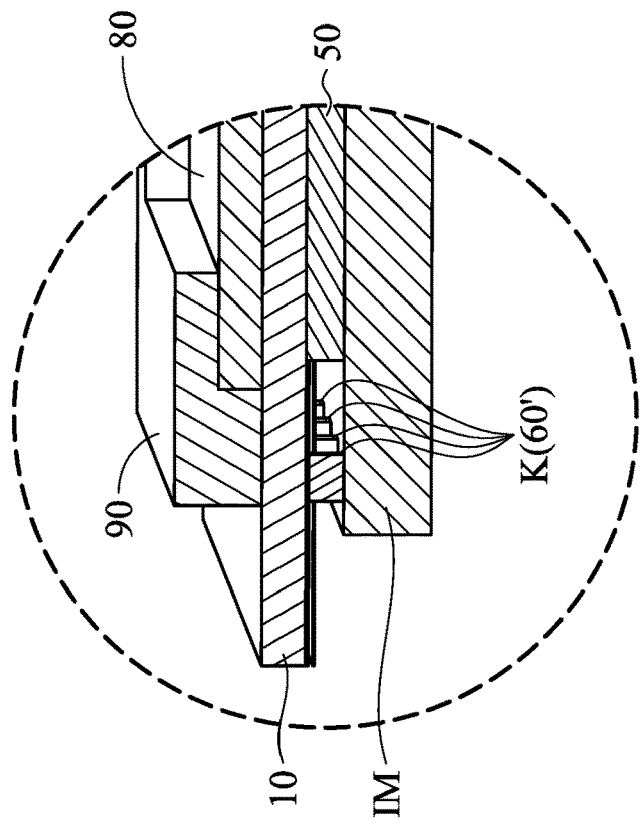
FIG. 5C is a schematic diagram in which the first plastic member 70 from FIG. 5B is omitted, in order to offer a clearer view of the soldering joint K.
Figure 5B:
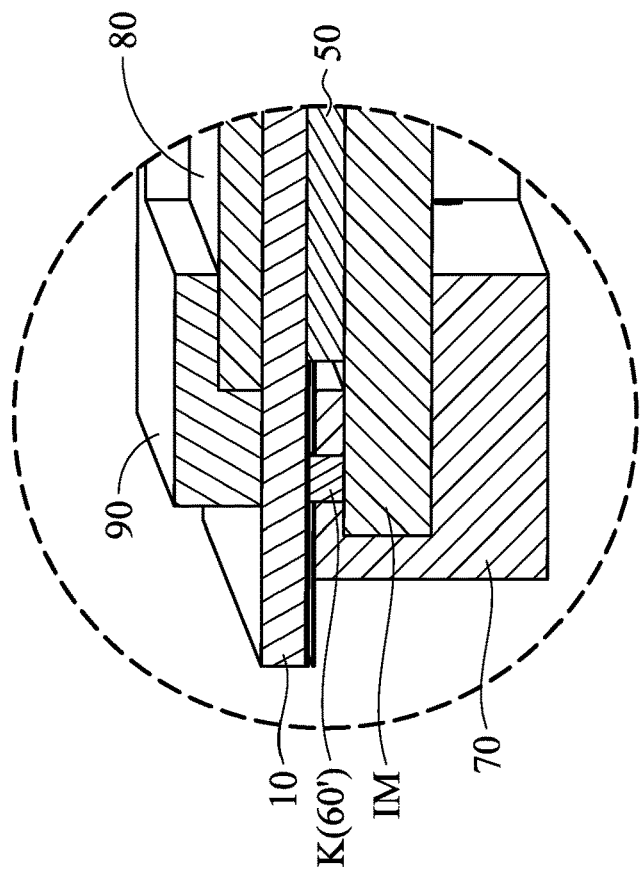
FIG. 5B is a cross-sectional diagram along line 5B-5B in FIG. 5A.

Refer to FIGS. 5A to 5C, which shows a photosensitive module 2 according to another embodiment of the present invention. The main difference between the photosensitive module 2 of the present embodiment and the photosensitive module 1 is that the photosensitive module 2 does not have a lead assembly 60, but it includes a soldering assembly 60'. Other component parts which are identical or which correspond to the embodiment of the photosensitive module 1 of FIGS. 4A to 4C, or which are only slightly different in appearance, are not described herein again, and the same or corresponding components are denoted by the same component symbols.

The soldering assembly 60' has a plurality of soldering joints K, and the image sensor IM is connected to the circuit layer 30 via the soldering joints K of the soldering assembly 60'. In the light direction O, the soldering assembly 60' overlaps the image sensor IM, or the image sensor IM completely covers the soldering assembly 60'. The soldering assembly 60' is encapsulated or covered by the first plastic member 70 to strengthen the mechanical structure. Since the photosensitive module 2 in this embodiment does not have any lead structure, the thickness of the entire module (in light direction O) can be further reduced to achieve miniaturization.

Embodiment 3

Figure 6A:
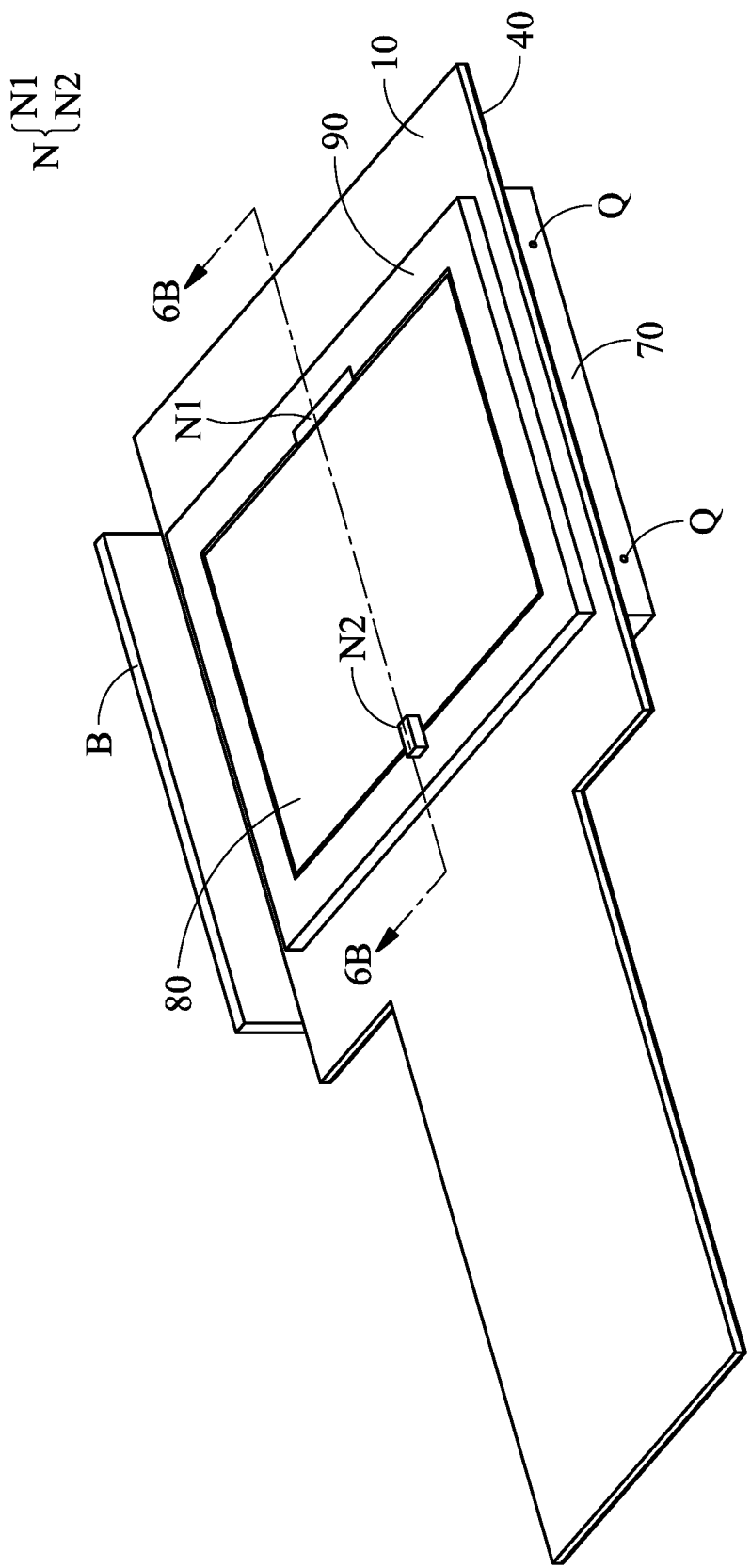
FIG. 6A is a schematic diagram of a photosensitive module according to another embodiment of the present invention.
Figure 6B:
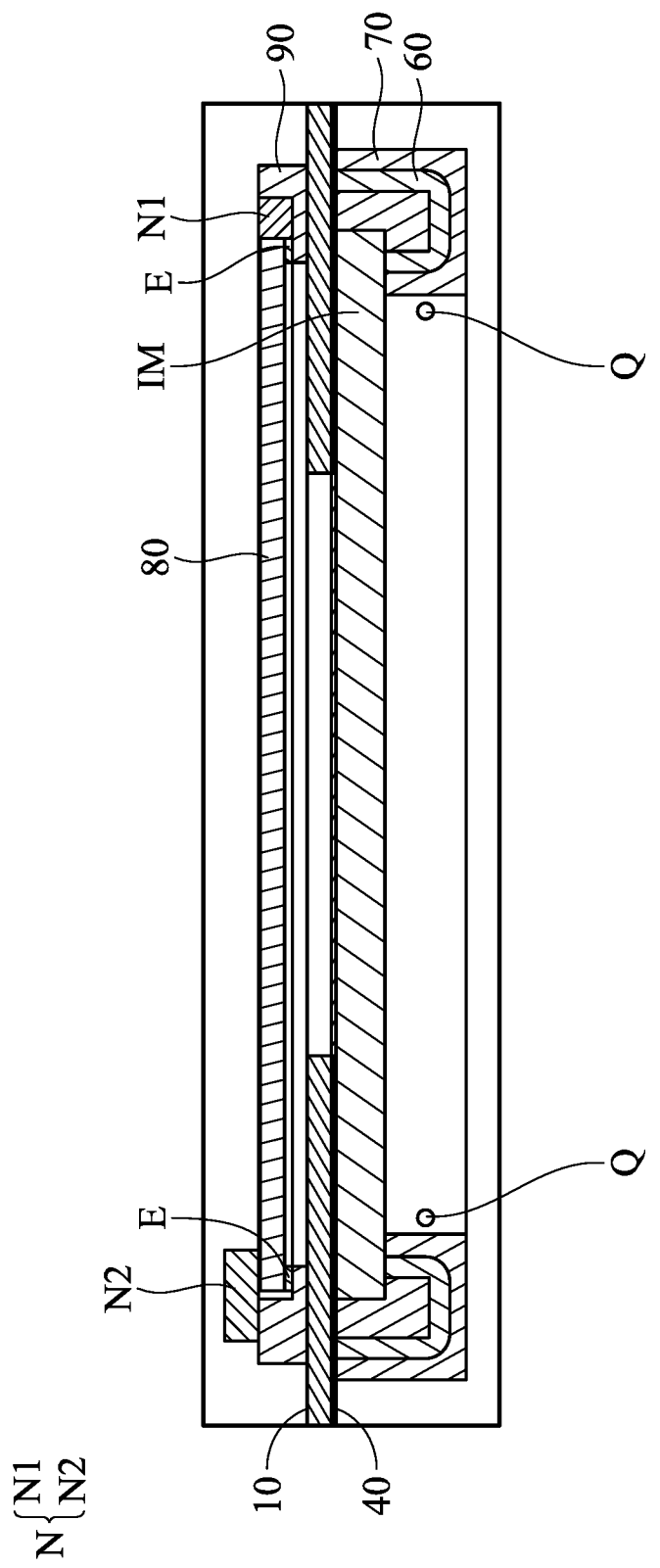
FIG. 6B is a cross-sectional view along line 6B-6B in FIG. 6A.

Refer to FIGS. 6A-6B, which shows a photosensitive module 3 according to another embodiment of the present invention. The main difference between the photosensitive module 3 of the present embodiment and the photosensitive module 1 (embodiment 1) is that the photosensitive module 3 further comprises a vibration assembly N, which can be an actuator assembly, disposed on the second plastic member 90 for driving or vibrating the transparent plate 80. The vibration assembly N at least partially overlaps the image sensors IM in the light-incident direction O. Foreign matter may become attached to the transparent plate 80 during processing or as a result of an impact with something in the immediate environment. The transparent plate 80 is vibrated by the vibration assembly N (for example, it can be electrically connected to one of the vibration motors disposed in the electronic device) to remove the foreign matter to improve the quality of the image. In addition, an elastic element E is disposed under the transparent plate 80, which is located between the transparent plate 80 and the second plastic member 90 and connected them. The elastic element E can be used to stabilize and protect the transparent plate 80 when vibrating.

In this embodiment, the vibration assembly N includes a plurality of (two in this embodiment) vibration members N1 and N2, and the two are disposed on the second plastic component 90 and configured to drive the transparent plate 80 to vibrate, wherein the vibrating member N1 is placed inside the second plastic member 90, and the vibrating member N2 is placed on the second plastic member 90. When viewed from the light-incident direction O, both vibration members N1 and N2 overlap at least partially with the image sensor IM, and the vibration members N1 and N2 drive the transparent plate 80 to move or vibrate in different directions. For example, the vibrating member N1 drives the transparent plate 80 to vibrate in the X-axis direction (a first direction), and the vibrating member N2 drives the transparent plate 80 to vibrate in the Y-axis direction (a second direction), so that the removal of foreign matter or dust can be greatly improved. Furthermore, a catching member B is disposed on the outer side of the first plastic member 70, adjacent to the substrate 10 and the transparent plate 80, for collecting dust or foreign matter falling from the vibrating transparent plate 80. In other embodiments, other numbers of vibration member can be provided, such as only one vibration member N1, or three or four vibration members on the second plastic component 90 may be disposed, to enhance the vibration effect.

Embodiment 4

Figure 7A:
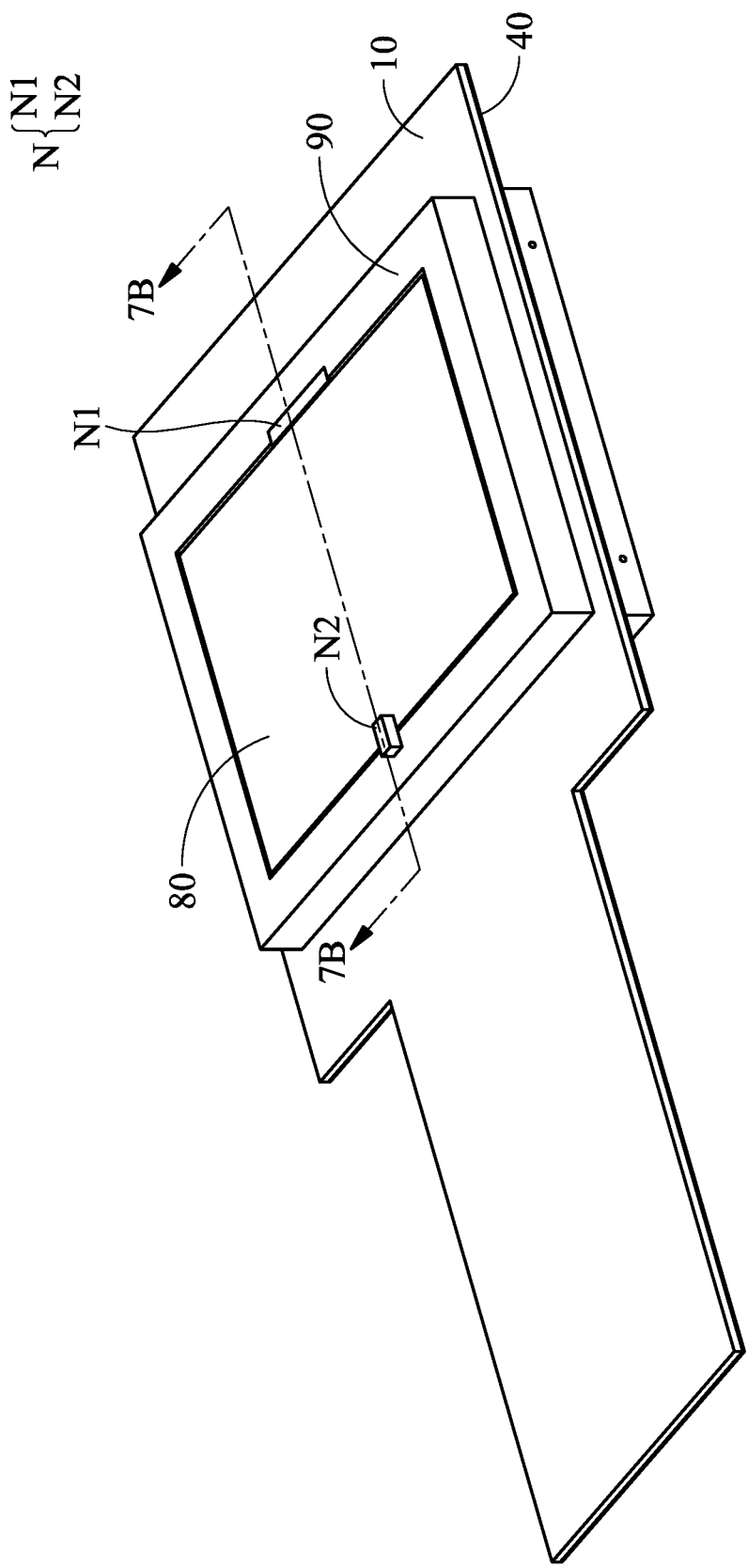
FIG. 7A is a schematic diagram of a photosensitive module according to another embodiment of the present invention.
Figure 7B:
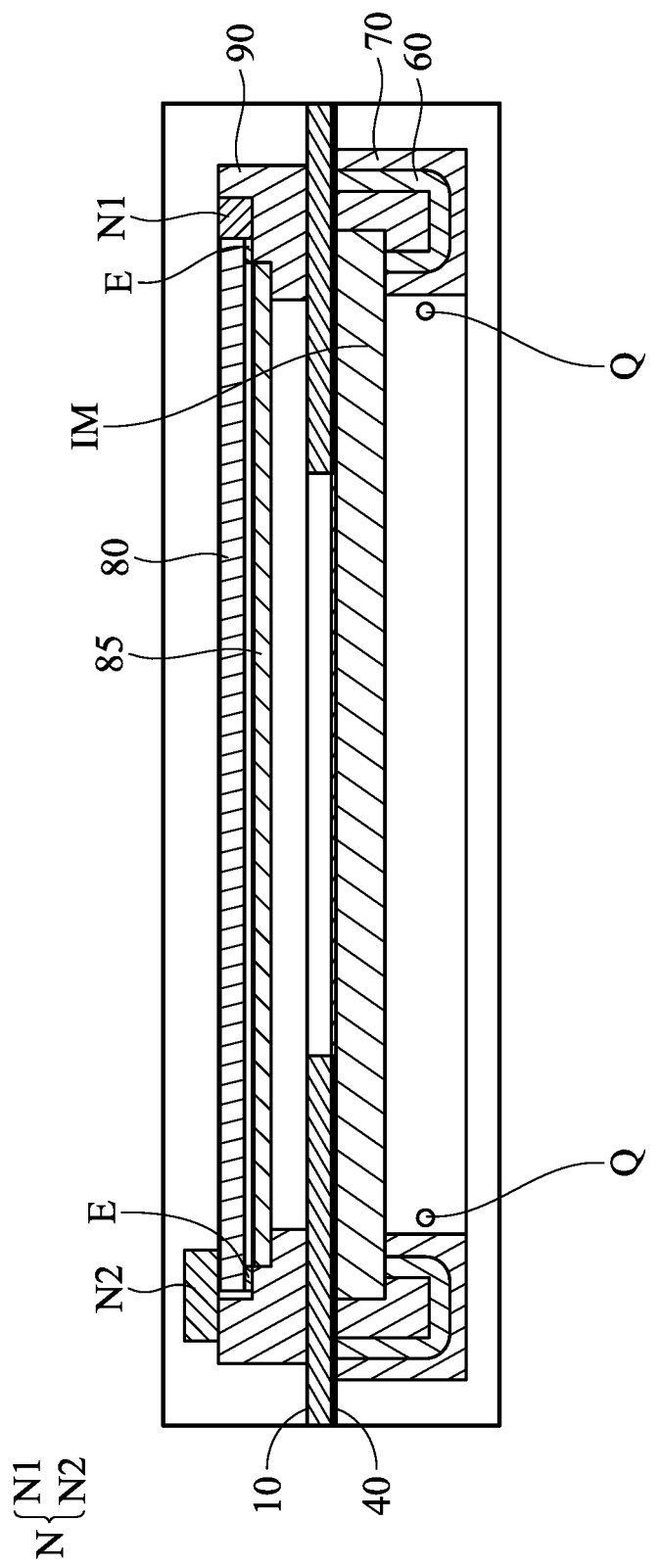
FIG. 7B is a cross-sectional view along line 7B-7B in FIG. 7A.

Refer to FIGS. 7A-7B, which shows a photosensitive module 4 according to another embodiment of the present invention. The main difference between the photosensitive module 4 of the present embodiment and the photosensitive module 3 (embodiment 3; FIGS. 6A-6B) is that the photosensitive module 4 includes a plurality of transparent plates 80 and 85 that are arranged along the light direction O and disposed on the second plastic member 90. Other component parts which are the same as, or which correspond to, the embodiment of the photosensitive module 3 in FIGS. 6A-6B, or which are only slightly different in appearance, are not described herein again, and the same or corresponding components are presented with the same component symbols.

In the present embodiment, the transparent plate 85 is located between the transparent plate 80 and the substrate 10/the image sensor IM. The transparent plate 80 completely covers or shields the transparent plate 85. In other words, the area of the first transparent plate 80 is larger (or at least equal to) the area of the second transparent plate 85. The transparent plate 85 is affixed on the second plastic member 90, and the transparent plate 80 is movably disposed on the second plastic member 90 and can be vibrated by the vibration assembly N to remove foreign matter or dust thereon. That is, the vibration assembly N drives the first transparent plate 80, which is farther from the image sensor IM. Therefore, since the second transparent plate 85 is completely shielded by the first transparent plate 80, when foreign matter falls on the photosensitive module 4, the first transparent plate 80 receives and blocks the foreign matter to the second transparent plate 85, and dust or foreign matter can be removed by the vibrating first transparent plate 80 driven by the vibration assembly N.

In summary, an embodiment of the present invention provides a photosensitive module, including a base assembly, a first transparent plate, an image sensor, and a first plastic member. The base assembly includes a substrate, and the substrate has a main body including a metal material. The first transparent plate is located on the first side of the base assembly. The image sensor is located on the second side of the base assembly and adjacent to the main body, wherein the first side is opposite the second side, and the substrate is disposed between the image sensor and the first transparent plate. The first plastic member is connected to the base assembly, and the image sensor is surrounded by the first plastic member. When the photosensitive module receives light, the light passes through the first transparent plate and an opening of the main body sequentially to the image sensor.

The embodiments in present invention have at least one of the following advantages or effects. By providing the thermal conductive adhesive to connect the image sensor to the substrate with a metal material, the heat dissipation efficiency of the photosensitive module can be improved. Furthermore, the first and second plastic members stabilize and protect the electrical connection structure and the transparent plate, thereby improving the reliability of the module. In addition, because the substrate having a metal material as a base is flat, the degree of skew of the image sensor relative to the substrate can be greatly reduced, and it is also advantageous to providing other electronic components on the substrate. This simplifies the overall circuit, and miniaturization can be achieved. Furthermore, the first transparent plate and the image sensor are respectively disposed on the two opposite sides of the base assembly, so that the manufacturing process can be easier.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. A photosensitive module, configured to receive light passing through a lens, comprising:
    a base assembly, including a substrate, wherein the substrate has a main body including a metal material;
    a first transparent plate, disposed on a first side of the base assembly;
    an image sensor, disposed on a second side of the base assembly and adjacent to the main body of the substrate, wherein the first side is opposite the second side, and the substrate is disposed between the image sensor and the first transparent plate;
    a first plastic member, connected to the base assembly, wherein the image sensor is surrounded by the first plastic member; and
    a first insulating layer, a second insulating layer and a circuit layer, wherein the circuit layer is disposed on the first insulating layer and the second insulating layer, and the circuit layer is electrically connected to the image sensor;
    wherein when the photosensitive module receives light, the light passes through the first transparent plate and an opening of the main body sequentially to the image sensor.

2. The photosensitive module as claimed in claim 1, further comprising a thermal adhesive disposed between the substrate and the image sensor, wherein the thermal adhesive is in contact with the main body of the substrate and the image sensor.

3. The photosensitive module as claimed in claim 2, wherein the first insulating layer and the second insulating layer each have an opening, the thermal adhesive is disposed in the openings, and the thermal adhesive is in contact with the main body of the substrate and the image sensor through the openings.

4. The photosensitive module as claimed in claim 3, wherein the thermal adhesive has two thermally conductive regions which are separated from each other, and the two thermally conductive regions are disposed on opposite sides of the opening of the second insulating layer.

5. The photosensitive module as claimed in claim 3, wherein the opening of the main body of the substrate is smaller than the opening of the first insulating layer and the opening of the second insulating layer.

6. The photosensitive module of claim 1, wherein the substrate further has an extended region connected to the main body, wherein the extended region has a metal material that is different than the metal material of the main body.

7. The photosensitive module as claimed in claim 1, wherein the first plastic member has at least one through hole penetrating a side wall of the first plastic member.

8. The photosensitive module as claimed in claim 7, wherein the first plastic member has a rectangular structure, the at least one through hole is located on a side wall of the rectangular structure, and the at least one through hole has an outer opening and an inner opening, wherein the outer opening is farther away from a reference surface of the substrate than the inner opening.

9. The photosensitive module as claimed in claim 1, further comprising a lead assembly connecting the image sensor and the base assembly, wherein the lead assembly is encapsulated by the first plastic member, and the lead assembly at least partially overlaps the image sensor in a light-incident direction.

10. The photosensitive module as claimed in claim 1, further comprising a soldering assembly connecting the image sensor to the base assembly, wherein the first plastic member encapsulates the soldering assembly, and the soldering assembly overlaps the image sensor in a light-incident direction.

11. The photosensitive module as claimed in claim 1, further comprising a second plastic member connected to the base assembly and carrying the first transparent plate, wherein the first plastic member is disposed on the first side of the base assembly, and the second plastic member is disposed on the second side of the base assembly.

12. The photosensitive module as claimed in claim 11, further comprising a vibration assembly disposed on the second plastic member for driving the first transparent plate.

13. The photosensitive module as claimed in claim 12, further comprising a second transparent plate, wherein the first transparent plate and the second transparent plate are arranged on the second plastic member along a light-incident direction.

14. The photosensitive module as claimed in claim 13, wherein the second transparent plate is located between the first transparent plate and the image sensor, and the second transparent plate is affixed to the second plastic member.

15. The photosensitive module as claimed in claim 12, wherein the vibration assembly includes at least two vibration members: a first vibration member and a second vibration member, and both the first vibration member and the second vibration member are disposed on the second plastic member and are configured to drive the second transparent plate;

wherein the first vibrating member drives the first transparent plate to move in a first direction, the second vibrating member drives the first transparent plate to move in a second direction, and the first direction is different than the second direction.

16. The photosensitive module as claimed in claim 12, further comprising a catching member disposed outside the first plastic member and adjacent to the first transparent plate, for capturing dust that falls from the transparent plate because of the vibration produced by the vibration assembly.

\* \* \* \* \*